(12) United States Patent
Nishita et al.

(10) Patent No.: US 11,316,012 B2
(45) Date of Patent: Apr. 26, 2022

(54) SEMICONDUCTOR DEVICE

(71) Applicant: Murata Manufacturing Co., Ltd., Nagaokakyo (JP)

(72) Inventors: Koichi Nishita, Nagaokakyo (JP); Masaki Takeuchi, Nagaokakyo (JP); Yutaka Takeshima, Nagaokakyo (JP); Kazuhiro Inoue, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/070,074

(22) Filed: Oct. 14, 2020

(65) Prior Publication Data

US 2021/0226007 A1  Jul. 22, 2021

(30) Foreign Application Priority Data

Jan. 17, 2020  (JP) .............................. JP2020-006117

(51) Int. Cl.
*H01L 29/06* (2006.01)

(52) U.S. Cl.
CPC ................ *H01L 29/0692* (2013.01)

(58) Field of Classification Search
None
See application file for complete search history.

(56) References Cited

U.S. PATENT DOCUMENTS

| | | | | |
|---|---|---|---|---|
| 5,614,743 | A * | 3/1997 | Mochizuki | ........ H01L 21/76898 257/E27.012 |
| 8,330,247 | B2 * | 12/2012 | Marenco | ............... H01L 29/945 257/520 |
| 10,418,182 | B2 * | 9/2019 | Fishburn | ............... H01L 23/642 |
| 2018/0315550 | A1 | 11/2018 | Ryou et al. | |
| 2019/0378893 | A1 * | 12/2019 | Ashimine | ......... H01L 21/28525 |
| 2021/0343856 | A1 * | 11/2021 | Haratipour | .............. H01L 28/60 |

FOREIGN PATENT DOCUMENTS

| | | |
|---|---|---|
| JP | H0888321 A | 4/1996 |
| JP | 2006261416 A | 9/2006 |
| JP | 5967153 B2 | 8/2016 |

* cited by examiner

*Primary Examiner* — Ali Naraghi
(74) *Attorney, Agent, or Firm* — ArentFox Schiff LLP

(57) ABSTRACT

A semiconductor device that includes a semiconductor substrate having a first main surface and a second main surface facing each other in a thickness direction, the first main surface including a trench. The trench has a predetermined depth in the thickness direction and has a substantially wedge shape that has a first side surface and a second side surface that face each other and are not parallel to each other, and a first end surface and a second end surface that face each other and are substantially parallel to each other. The first side surface and the second side surface intersect each other at a line, or extension surfaces of the first side surface and the second side surface extended in the thickness direction intersect each other at a line, and the line extends in a first direction that does not align with a cleavage plane of the semiconductor substrate.

14 Claims, 7 Drawing Sheets

SEMICONDUCTOR DEVICE

CROSS REFERENCE TO RELATED APPLICATIONS

The present application claims priority to Japanese Patent Application No. 2020-006117, filed Jan. 17, 2020, the entire contents of which is incorporated herein by reference.

BACKGROUND OF THE INVENTION

Field of the Invention

The present invention relates to a semiconductor device.

Description of the Related Art

There is known a capacitor that can increase its capacitance by forming fine grooves (also called trenches) on a surface of a semiconductor substrate to increase a surface area, and forming metal insulator metal (MIM) serving as the capacitor on the surface.

US 2018/0315550 A (Patent Document 1) discloses a capacitor in which a trench in a V-shape is formed in a substrate and a MIM is formed on a surface of the trench with an insulating layer interposed therebetween.

Japanese Patent No. 5967153 (Patent Document 2) discloses a MIM that is formed on an uneven surface generated by forming grooves on a surface of a substrate material, the grooves each being in a stripe-like shape having a depth of 5 µm, a width of 3 µm, and an interval of 2 µm. Patent Document 2 states that this enables reducing a chip in size to about ⅓ of a typical chip to acquire as much capacity as the typical chip.

Japanese Patent Application Laid-Open No. 08-88321 (Patent Document 3) discloses a method for forming a trench by etching a surface of a semiconductor substrate and forming a silicon oxide film on a surface of the trench using thermal oxidation or a CVD method.

Japanese Patent Application Laid-Open No. 2006-261416 (Patent Document 4) discloses trenches that are each in a polygonal shape in a plan view and that are regularly disposed, the polygonal shape having sides any one of which is lengthened.

Unfortunately, the capacitor described in Patent Document 1 may cause a crack in a substrate during a manufacturing process.

Inventors' diligent studies of this problem presume that the crack is caused by strain generated when a film is formed on a surface of a trench. When an insulating layer is provided on an inner surface of a trench, the insulating layer is formed by a thermal oxidation method or a CVD method as disclosed in Patent Document 3. The thermal oxidation method causes a thermal oxide film to grow, expanding from a surface of a groove, so that it is conceivable that a trench having a tapered tip as in Patent Document 1 causes growth thermal oxide films to come into contact with each other at the tip of the trench, thereby causing stress in an outward direction at the contact point.

A substrate to be provided with a trench originally has a predetermined rigidity so that formation of the trench does not cause a crack. Additionally, the thermal oxide films coming into contact each other in a deep portion of each trench cause slight stress so that only forming the thermal oxide films on the surface of the trench does not cause a crack in a base material. However, when the substrate has a cleavage plane, it is conceivable that a crack is likely to occur when a generation point of stress caused by the thermal oxide films coming into contact with each other aligns with a cleavage plane direction of the substrate.

For example, when trenches are regularly disposed as disclosed in Patent Document 4, or even when a single trench extends in a predetermined direction, it is conceivable that a base material is likely to be cracked along a cleavage plane when stress is applied in a direction aligned with the cleavage plane.

The present invention is made to solve the above problems, and an object of the present invention is to provide a semiconductor device in which a crack is less likely to occur during a manufacturing process.

SUMMARY OF THE INVENTION

A semiconductor device according to a first embodiment of the present invention includes a semiconductor substrate having a first main surface and a second main surface facing each other in a thickness direction, the first main surface including a trench; an insulating layer on a surface of the trench; a first electrode layer on the insulating layer; a dielectric layer on the first electrode layer; and a second electrode layer on the dielectric layer. The trench has a predetermined depth in the thickness direction of the semiconductor substrate and has a substantially wedge shape that has a first side surface and a second side surface that face each other and are not parallel to each other, and a first end surface and a second end surface that face each other and are substantially parallel to each other. The first side surface and the second side surface intersect each other at a line, or extension surfaces of the first side surface and the second side surface extended in the thickness direction intersect each other at a line, and the line extends in a first direction that does not align with a cleavage plane of the semiconductor substrate.

A semiconductor device according to a second embodiment of the present invention includes a semiconductor substrate having a first main surface and a second main surface facing each other in a thickness direction, the first main surface including a plurality of trenches; an insulating layer on a surface of the trench; a first electrode layer on the insulating layer; a dielectric layer on the first electrode layer; and a second electrode layer on the dielectric layer. the plurality of trenches have a predetermined depth in the thickness direction of the semiconductor substrate and have a substantially conical shape that has at least a portion in which a sectional area in a surface parallel to the first main surface decreases from the first main surface toward the second main surface. A first direction connecting apexes of the trenches closest to each other does not align with a cleavage plane of the semiconductor substrate.

The present invention enables providing a semiconductor device in which a crack is less likely to occur during a manufacturing process.

DETAILED DESCRIPTION OF PREFERRED EMBODIMENTS OF THE INVENTION

Hereinafter, a semiconductor device of the present invention will be described. However, the present invention is not limited to the following structure, and can be appropriately modified and applied without changing the gist of the present invention. The present invention also includes a combination of two or more desirable structures of each embodiment of the present invention described below.

As used herein, the term "substantially" is to be given it's plain meaning to denote that a strict numerical boundary is to be interpreted as "the same as or very close to" the term being modified. For example, "substantially parallel" includes arrangements that are exactly parallel as well as those that are not exactly parallel.

[Semiconductor Device]

A semiconductor device according to a first embodiment of the present invention includes a semiconductor substrate having a first main surface and a second main surface facing each other in a thickness direction, the first main surface including a trench; an insulating layer on a surface of the trench; a first electrode layer on the insulating layer; a dielectric layer on the first electrode layer; and a second electrode layer on the dielectric layer. The trench has a predetermined depth in the thickness direction of the semiconductor substrate and has a substantially wedge shape that has a first side surface and a second side surface that face each other while not being parallel to each other, and a first end surface and a second end surface that face each other while being substantially parallel to each other. The first side surface and the second side surface intersect each other at a line, or extension surfaces of the first side surface and the second side surface that extend in the thickness direction intersect each other at a line, and the line extends in a first direction that does not align with or extend along a cleavage plane of the semiconductor substrate.

Figure 1:
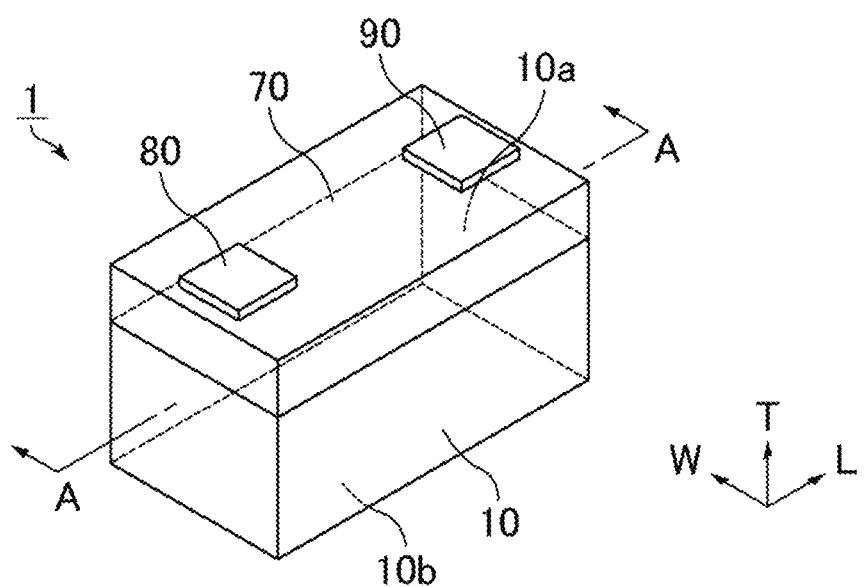
FIG. 1 is a perspective view schematically illustrating an example of a semiconductor device according to a first embodiment of the present invention.
Figure 2:
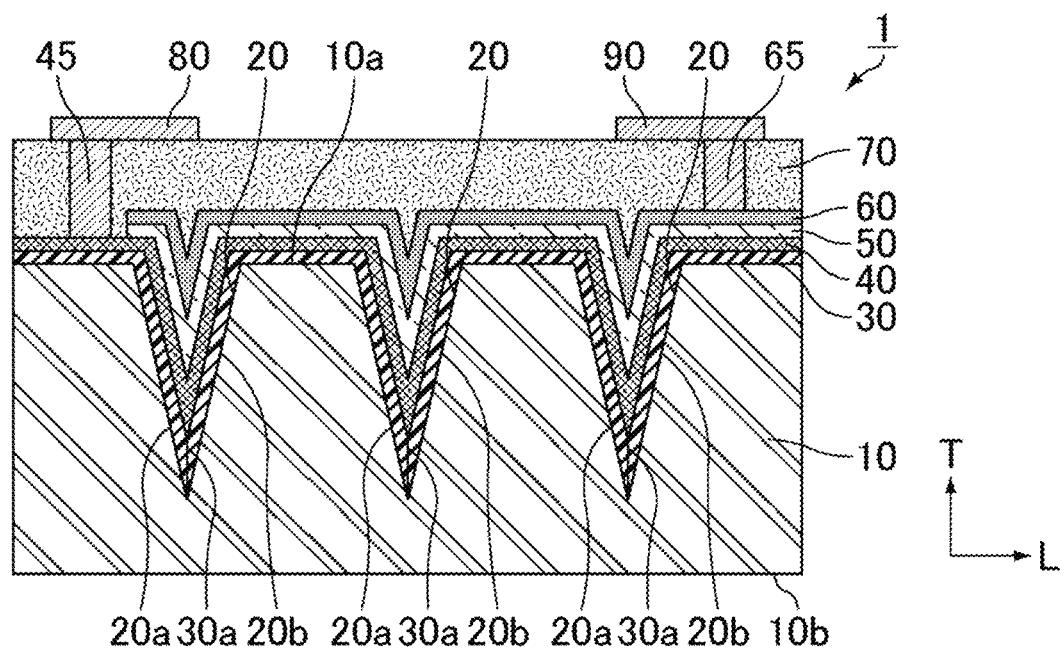
FIG. 2 is a sectional view taken along line A-A in FIG. 1.

FIG. 1 is a perspective view schematically illustrating an example of the semiconductor device according to the first embodiment of the present invention. FIG. 2 is a sectional view taken along line A-A in FIG. 1. As illustrated in FIGS. 1 and 2, a semiconductor device 1 includes a semiconductor substrate 10 having a first main surface 10a and a second main surface 10b facing each other in a thickness direction, the first main surface 10a being formed with a trench 20; an insulating layer 30 on a surface of the trench 20; a first electrode layer 40 on the insulating layer 30; a dielectric layer 50 on the first electrode layer 40; and a second electrode layer 60 on the dielectric layer 50.

The first electrode layer 40 is electrically connected a first external electrode 80 with a first extended portion 45 interposed therebetween. The second electrode layer 60 is electrically connected a second external electrode 90 with a second extended portion 65 interposed therebetween. The semiconductor device according to the first embodiment of the present invention may be provided with a plurality of first external electrodes and second external electrodes.

As illustrated in FIG. 2, the trench 20 may include an interface 30a in which the insulating layer 30 provided on a first side surface 20a and the insulating layer 30 provided on a second side surface 20b are in contact with each other. When the interface 30a in contact with the insulating layer 30 provided on the first side surface 20a and the insulating layer 30 provided on the second side surface 20b exists in the trench 20, the semiconductor substrate is more likely to be stressed and cracked due to the insulating layers interfering with each other. In contrast, the semiconductor device according to the first embodiment of the present invention has the first direction of the line of intersection of the first and second side surfaces that does not align with the direction along the cleavage plane of the semiconductor substrate. Thus, even when stress due to the insulating layers interfering with each other is applied to the substrate, a crack can be prevented from occurring.

Figure 3:
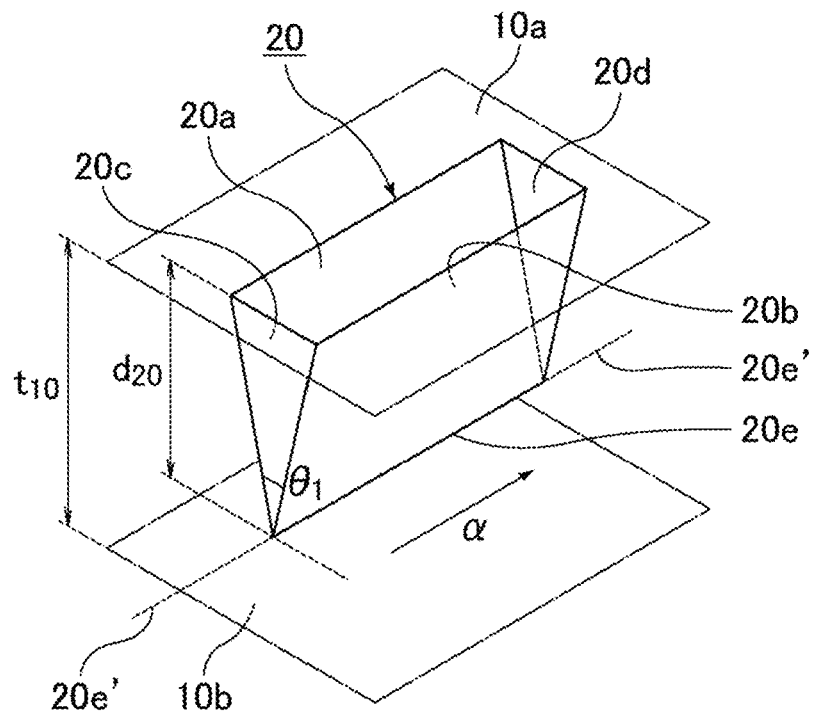
FIG. 3 is a perspective view schematically illustrating a trench formed in a semiconductor substrate illustrated in FIG. 2.

FIG. 3 is a perspective view schematically illustrating a trench formed in a semiconductor substrate illustrated in FIG. 2. The trench 20 has a substantially wedge shape composed of the first side surface 20a, the second side surface 20b, the first end surface 20c, and the second end surface 20d, and extends from the first main surface 10a toward the second main surface 10b of the semiconductor substrate 10. The first side surface 20a and the second side surface 20b face each other in a direction orthogonal to the thickness direction, and have a distance therebetween decreasing from the first main surface 10a toward the second main surface 10b, and thus causing them not to be parallel to each other. In contrast, the first end surface 20c and the second end surface 20d are disposed apart from each other and are substantially parallel to each other so that the first end surface 20c and the second end surface 20d face each other in a direction orthogonal to the thickness direction and in a direction orthogonal to the direction in which the first side surface 20a and the second side surface 20b face each other. The first side surface 20a, the second side surface 20b, the first end surface 20c, and the second end surface 20d are each not parallel to the first main surface 10a of the semiconductor substrate 10.

The substantially wedge shape has a first side surface and a second side surface that face each other and are not parallel to each other, and a first end surface and a second end surface that face each other and are substantially parallel to each other. The first side surface and the second side surface are each connected at one end portion to the first end surface, and connected at the other end portion to the second end surface. The first side surface and the second side surface are each preferably in a substantially rectangular shape, and the first end surface and the second end surface are each preferably in a substantially isosceles triangular shape. In this case, two sides equal in length constituting each of substantially isosceles triangles serving as the first end surface and second end surface are common to corresponding sides of approximate rectangles serving as the first side surface and the second side surface. Examples of the substantially isosceles triangle includes an isosceles triangle in which two base angles are not exactly equal to each other, and an isosceles triangle in which two equal sides are not exactly equal in length. The examples thereof also include a trapezoidal shape acquired by removing a part of an isosceles triangle, including an apex angle.

The first side surface 20a and the second side surface 20b intersect each other at a line 20e extending in a direction that is referred to as a first direction α. That is, the trench 20 includes a substantially rectangular opening such as a rectangle when viewed from above the first main surface 10a; the first side surface 20a and the second side surface 20b that correspond to respective long sides of the opening, and that have a distance therebetween in a section taken along the thickness direction decreasing from the first main surface 10a toward the second main surface 10b; and the first end surface 20c and the second end surface 20d that correspond to respective short sides, and that have a constant distance therebetween from the first main surface 10a toward the second main surface 10b. Although FIG. 3 illustrates a case where the first direction α is substantially parallel to the first main surface 10a and the second main surface 10b of the semiconductor substrate 10, the first direction α may not be parallel to the first main surface 10a and the second main surface 10b of the semiconductor substrate 10.

The trench 20 has a depth $d_{20}$ that is preferably 300 nm to 10000 nm. The depth $d_{20}$ of the trench is preferably 0.1% to 50% of a thickness $t_{10}$ of the semiconductor substrate 10.

As illustrated in FIG. 3, a sectional shape of the trench 20 taken along a direction parallel to the first end surface 20c and the second end surface 20d is a tapered shape. The tapered shape is preferably configured as illustrated in FIG. 3 such that a distance between the first side surface 20a and the second side surface 20b in a direction parallel to the first main surface 10a of the semiconductor substrate 10 decreases from the first main surface 10a toward the second main surface 10b.

Although an angle $\theta_1$ formed by the first side surface 20a and the second side surface 20b is not particularly limited, it may be 30° or less. When $\theta_1$ is 30° or less, an interface in contact with the insulating layer 30 formed on the first side surface 20a and the insulating layer 30 formed on the second side surface 20b is likely to occur. This causes the semiconductor substrate to be more likely to be stressed and cracked due to the insulating layers interfering with each other. In contrast, the semiconductor substrate according to the first embodiment of the present invention has the first direction that does not align with the direction along the cleavage plane of the semiconductor substrate. Thus, even when stress due to the insulating layers interfering with each other is applied to the substrate, a crack can be prevented from occurring.

The angle $\theta_1$ formed by the first side surface 20a and the second side surface 20b can be checked by observing a cut surface of the semiconductor substrate 10, which is obtained by cutting the semiconductor substrate in a direction parallel to the first end surface 20c and the second end surface 20d, using a scanning electron microscope (SEM) or the like. The angle $\theta_1$ formed by the first side surface 20a and the second side surface 20b coincides with an apex angle of a substantially isosceles triangle that is assumed as a shape formed by the first end surface 20c and the second end surface 20d. The first side surface 20a and the second side surface 20b are each not required to be a smooth surface, and may be each formed with asperities.

When asperities are formed on the first side surface and/or the second side surface, an angle formed by the first side surface and the second side surface can be obtained by the following method. First, a trench is observed on a cut surface obtained by cutting the semiconductor substrate in a direction parallel to the first end surface and the second end surface. Then, on the cut surface, a line segment that minimizes the sum of squares of displacement from the first side surface and a line segment that minimizes the sum of squares of displacement from the second side surface are obtained. The two line segments form an angle that is an angle formed by the first side surface and the second side surface. The above method can be used even when the trench has a bottom surface.

Each of surfaces constituting the trench can be checked by, for example, observing a section of the semiconductor substrate using a SEM. Each of the surfaces constituting the trench also can be checked by observing a surface of the semiconductor substrate constituting the corresponding one of the surfaces of the trench, or by observing an interface between the semiconductor substrate and each of the insulating layers formed on the respective surfaces of the trench using the SEM. When the interface between the semiconductor substrate and each of the insulating layers cannot be checked, each of the surfaces constituting the trench may be recognized regardless of thickness of the corresponding one of the insulating layers. When the interface between the semiconductor substrate and each of the insulating layers can be checked, the interface between the semiconductor substrate and each of the insulating layers is recognized as the corresponding one of the surfaces constituting the trench.

Figure 4:
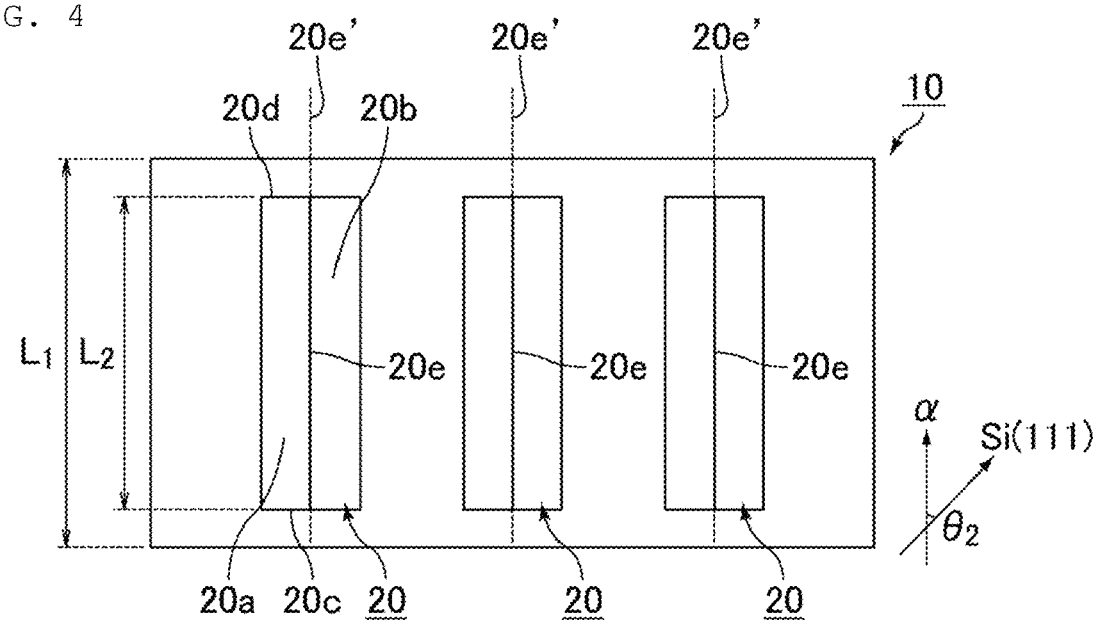
FIG. 4 is a top view schematically illustrating the semiconductor substrate illustrated in FIG. 2.

FIG. 4 is a top view schematically illustrating the semiconductor substrate illustrated in FIG. 2. As shown in FIG. 4, the first side surface 20a and the second side surface 20b constituting the trench 20 intersect each other at the line 20e that extends forming an extension line 20e' in the first direction α that does not align with a direction along a cleavage plane of the semiconductor substrate 10 (a direction indicated by Si(111) in FIG. 4). The first direction α is inclined by $\theta_2$ with respect to the direction along the cleavage plane of the semiconductor substrate 10. The angle $\theta_2$ is preferably 5° to 85°.

The line 20e at which the first side surface 20a and the second side surface 20b of the trench 20 intersect each other has a length $L_2$ that is preferably 50% to 90% of a length $L_1$ of the semiconductor substrate 10 existing on the extension line 20e' extended from the line 20e. The line 20e at which the first side surface 20a and the second side surface 20b of the trench 20 intersect each other is not necessarily parallel to the first main surface 10a and the second main surface 10b of the semiconductor substrate 10.

Although FIG. 4 illustrates an example of the semiconductor substrate 10 in which only one trench is formed along the first direction α, the semiconductor device according to the first embodiment of the present invention, two or more trenches may be disposed side by side along the first direction α. In this case, the plurality of trenches preferably aligns with the same first direction α. Additionally, all the trenches disposed side by side on a straight line along the first direction α have lines, at each of which the first side surface and the second side surface intersect each other, the lines preferably having a total length that is 50% to 90% of a length of the semiconductor substrate 10 in the first direction α.

The trench is likely to be stressed at its deepest portion when the insulating layer, the first electrode layer, the dielectric layer, and the second electrode layer provided on each of the first side surface and the second side surface come into contact with each other. Thus, when the first direction α is along the cleavage plane of the semiconductor substrate, a crack along the cleavage plane is likely to occur in the semiconductor substrate. The semiconductor device according to the first embodiment of the present invention has the first direction that does not align with the direction along the cleavage plane of the semiconductor substrate, so that the crack can be prevented from occurring.

The semiconductor device according to the first embodiment of the present invention may be configured such that the first side surface and the second side surface constituting the trench are not in direct contact with each other. A state where the first side surface and the second side surface constituting the trench are in direct contact with each other means a case where the first side surface and the second side surface are in contact with each other at a bottom of the trench. In contrast, a state where the first side surface and the second side surface constituting the trench are not in direct contact with each other means a case where the trench includes a bottom surface other than the first side surface and the second side surface, the bottom surface connecting the first side surface and the second side surface.

Figure 5:
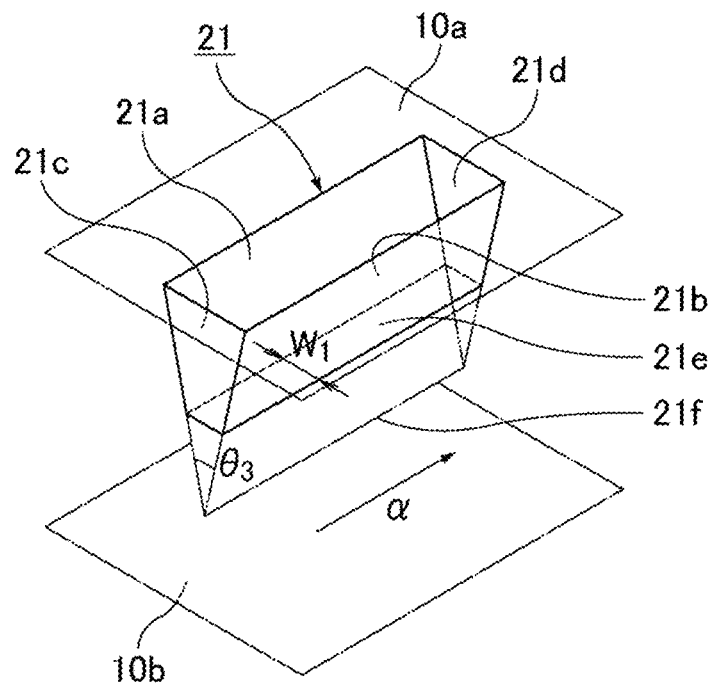
FIG. 5 is a perspective view schematically illustrating another example of the trench of the semiconductor device according to the first embodiment of the present invention.

FIG. 5 is a perspective view schematically illustrating another example of the trench of the semiconductor device according to the first embodiment of the present invention. A trench 21 has a substantially wedge shape including a first side surface 21a, a second side surface 21b, a first end surface 21c, a second end surface 21d, and a first bottom surface 21e. The first bottom surface 21e is provided between the first side surface 21a and the second side surface 21b so that the first side surface 21a and the second side surface 21b are not in direct contact with each other. A surface virtually extended from the first side surface 21a in a thickness direction and a surface virtually extended from the second side surface 21b in the thickness direction intersect each other at a line 21f extending in a direction that is referred to as a first direction α. An angle $\theta_3$ formed by the first side surface 21a and the second side surface 21b may be 30° or less.

To increase the number of trenches per unit area, a distance $W_1$ between the first side surface 21a and the second side surface 21b at a deepest portion of the trench 21 (a position where the first bottom surface 21e is provided) is preferably set to 2 μm or less. Although the distance $W_1$ of 2 μm or less between the first side surface 21a and the second side surface 21b in the deepest portion of the trench 21 causes a crack to be likely to occur in the semiconductor substrate due to insulating layers formed on the surfaces of the trench, the semiconductor device according to the first embodiment of the present invention can prevent the crack from occurring.

Figure 6:
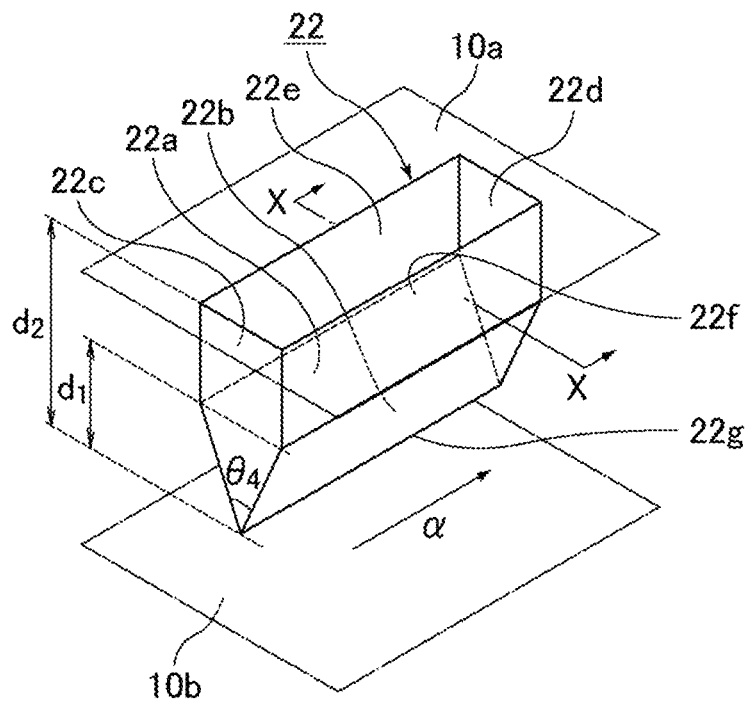
FIG. 6 is a perspective view schematically illustrating yet another example of the trench of the semiconductor device according to the first embodiment of the present invention.
Figure 7:
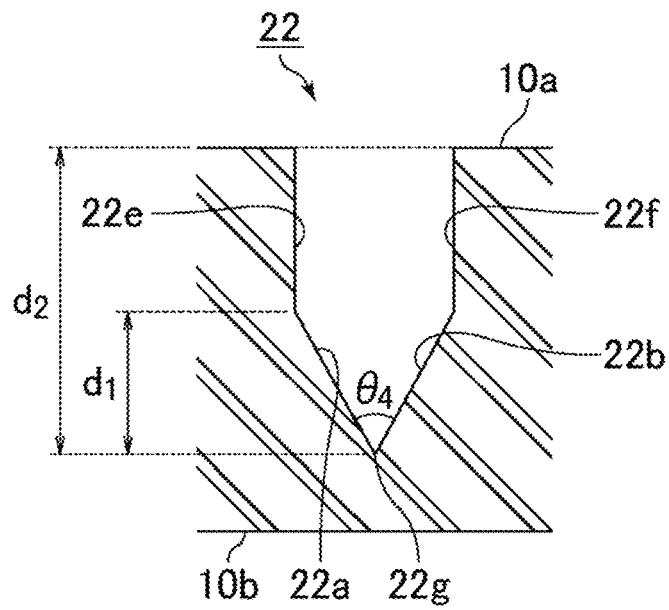
FIG. 7 is a sectional view taken along line X-X in FIG. 6.

The semiconductor device according to the first embodiment of the present invention may be configured such that in a cut surface of the semiconductor substrate in a direction parallel to the first end surface and the second end surface, the first side surface and the second side surface of the trench extend shorter in the thickness direction of the semiconductor substrate than the first end surface and the second end surface of the trench. With reference to FIGS. 6 and 7, there is described a case where the first side surface and the second side surface of the trench extend shorter in the thickness direction of the semiconductor substrate than the first end surface and the second end surface of the trench in the cut surface.

FIG. 6 is a perspective view schematically illustrating yet another example of the trench of the semiconductor device according to the first embodiment of the present invention. FIG. 7 is a sectional view taken along line X-X in FIG. 6. FIG. 7 is also a sectional view of the trench illustrated in FIG. 6 as viewed from a section parallel to the first end surface and the second end surface. As illustrated in FIG. 6, a trench 22 has a substantially wedge shape in a cut surface of a semiconductor substrate 10 in a direction parallel to a first end surface 22c and a second end surface 22d, the substantially wedge shape including a first side surface 22a, a second side surface 22b, the first end surface 22c, the second end surface 22d, a third side surface 22e, and a fourth side surface 22f. As illustrated in FIG. 7, the first side surface 22a and the second side surface 22b extends in the thickness direction of the semiconductor substrate 10 by a length indicated by a double-headed arrow $d_1$. In contrast, the first end surface 22c and the second end surface 22d extending in the thickness direction of the semiconductor substrate 10 by a length indicated by a double-headed arrow $d_2$. The length $d_1$ is shorter than the length $d_2$. The third side surface 22e is provided between the first main surface 10a and the first side surface 22a. The fourth side surface 22f is provided between the first main surface 10a and the second side surface 22b. The third side surface 22e has a substantially rectangular shape formed by a locus obtained by extending a side of the first side surface 22a, close to the first main surface 10a, to the first main surface 10a along the thickness direction of the semiconductor substrate 10. The fourth side surface 22f has a substantially rectangular shape formed by a locus obtained by extending a side of the second side surface 22b, close to the first main surface 10a, to the first main surface 10a along the thickness direction of the semiconductor substrate 10. The first side surface 22a and the second side surface 22b intersect each other at a line 22g extending in a direction that is referred to as a first direction α.

An angle $\theta_4$ formed by the first side surface 21a and the second side surface 22b is not particularly limited and may be, for example, 30° or less.

The third side surface 22e and the fourth side surface 22f face each other in substantially parallel, and connect the first main surface 10a and the first side surface 22a, and the first main surface 10a and the second side surface 22b, respectively. Thus, the third side surface 22e is disposed closer to the first main surface 10a side than the first side surface 11a, and the fourth side surface 22f is disposed closer to the first main surface 10a than the second side surface 22b.

The third side surface 22e and the fourth side surface 22f may be substantially parallel to each other or may not be parallel to each other. Examples of the third side surface 22e and the fourth side surface 22f that are not parallel to each other include a case where a distance between the third side surface 22e and the fourth side surface 22f decreases from the first main surface 10a toward the second main surface 10b.

When the semiconductor device according to the first embodiment of the present invention includes two or more trenches in the semiconductor substrate, the trenches may be identical or different in shape.

Subsequently, each component constituting the semiconductor device according to the first embodiment of the present invention will be described.

Examples of material constituting the semiconductor substrate include silicon. When the semiconductor substrate is a silicon substrate, the first main surface formed with a trench is preferably a Si{100} plane. The Si{100} plane includes a Si(1 0 0) plane, a Si(0 1 0) plane, a Si(0 0 1) plane, a Si(−1 0 0) plane, a Si(0 −1 0), and a Si(0 0 −1) plane. When the semiconductor substrate is a silicon substrate, the cleavage plane is a Si{111} plane. The Si{111} plane includes a Si(1 1 1) plane, a Si(−1 1 1) plane, a Si(1 −1 1) plane, and a Si(1 1 −1) plane.

The semiconductor substrate preferably has an electrical resistivity of $10^{-5}$ Ωcm to $10^{5}$ Ωcm.

The semiconductor substrate is not particularly limited in external dimensions, and preferably has a length of 1 mm to 3 mm, a thickness of 100 μm to 1000 μm, and a width of 1 mm to 3 mm.

The insulating layer is preferably made of oxide of the material constituting the semiconductor substrate. When the semiconductor substrate is made of silicon, the insulating layer is preferably made of silicon oxide.

The insulating layer preferably has a thickness of 1 μm to 3 μm. When the insulating layer has a thickness of 1 μm or more, withstand voltage of the semiconductor device can be improved. The thickness of the insulating layer is acquired by observing a cut surface acquired by cutting the semiconductor substrate in the thickness direction using a SEM to acquire the thickness of the insulating layer on a perpendicular drawn from a position, at which the side surface extending from a surface of the trench exposed to the first main surface to a deepest portion of the trench is divided into two equal portions, toward the insulating layer.

Examples of material constituting the first electrode layer include metals such as Cu, Ag, Au, Al, Ni, Cr, and Ti, and conductors containing these metals. The first electrode layer may include two or more conductor layers made of the material described above.

The first electrode layer is not particularly limited in thickness, and preferably has a thickness of 0.3 μm to 10 μm, and more preferably has a thickness of 0.5 μm to 3 μm.

Examples of material constituting the dielectric layer include materials having dielectric properties or insulating properties, including oxides such as SiO, $Al_2O_3$, $HfO_2$, $Ta_2O_5$, and $ZrO_2$, and nitrides such as $Si_3N_4$.

The dielectric layer is not particularly limited in thickness, and preferably has a thickness of 0.02 μm to 2 μm.

As material constituting the second electrode layer, material similar to that constituting the first electrode layer can be preferably used. The second electrode layer is not particularly limited in thickness, and preferably has a thickness of 0.3 μm to 10 μm, and more preferably has a thickness of 0.5 μm to 5 μm.

Examples of material constituting the first extended portion and the second extended portion include Cu and Al.

Examples of material constituting the first external electrode and the second external electrode include Cu and Al. The first external electrode and the second external electrode each may have an outermost surface formed with a plating layer. Examples of the plating layer include a Au plating layer and a Sn plating layer. The material constituting the first external electrode and the material constituting the second external electrode may be identical to or different from each other.

The semiconductor device of the present invention may include a protective layer for protecting the dielectric layer and/or the second electrode layer from moisture, being formed partly on the dielectric layer and the second electrode layer. Examples of material constituting the protective layer include polyimide resin, silicon nitride, and silicon oxide.

The protective layer is not particularly limited in thickness, and preferably has a thickness of 1 μm to 20 μm.

Subsequently, a semiconductor device according to a second embodiment of the present invention will be described. The semiconductor device according to the second embodiment of the present invention has a structure common to the semiconductor device according to the first embodiment of the present invention except a shape of a trench and placement of the trench.

The semiconductor device according to the second embodiment of the present invention includes a semiconductor substrate having a first main surface and a second main surface facing each other in a thickness direction, the first main surface including a plurality of trenches; an insulating layer on a surface of the trench; a first electrode layer on the insulating layer; a dielectric layer on the first electrode layer; and a second electrode layer on the dielectric layer. The plurality of trenches have a predetermined depth in the thickness direction of the semiconductor substrate and have a substantially conical shape that has at least a portion in which a sectional area in a surface parallel to the first main surface decreases from the first main surface toward the second main surface. A first direction connecting apexes of the trenches closest to each other does not align with a direction along a cleavage plane of the semiconductor substrate in a plane parallel to the first main surface of the semiconductor substrate.

When each of the trenches has a substantially conical shape, stress is likely to occur at an apex of each of the trenches in the substantially conical shape. Thus, when apexes of the trenches in the substantially conical shape are connected to each other in a direction along a cleavage plane of the semiconductor substrate, a crack is likely to occur in the semiconductor substrate. The semiconductor device according to the second embodiment of the present invention is configured such that the first direction in which the apexes of the trenches in the substantially conical shape are connected to each other does not align with the direction along the cleavage plane of the semiconductor substrate. Thus, the semiconductor substrate can be prevented from cracking.

The semiconductor device according to the second embodiment of the present invention includes the trenches each having the substantially conical shape. Examples of a trench shape include a substantially cone shape such as a cone shape and an elliptical cone shape, and a substantially polygonal pyramid shape such as a substantially triangular pyramid shape and a substantially quadrangular pyramid shape. An apex of a substantially conical shape means a point where side surfaces constituting the wedge intersect each other. Each of the trenches may have a shape in which an apex portion of the substantially conical shape is removed. In this case, a trench having a substantially cone shape has a bottom surface at its deepest portion. Even when a trench has a shape in which an apex portion of a substantially conical shape is removed, an apex is defined as a point at which extension surfaces extended in a thickness direction of the semiconductor substrate from respective side surfaces constituting the wedge intersect each other. A trench provided at its deepest portion with a bottom surface has an apex of a substantially conical shape, defined as an intersection of surfaces extended toward the second main surface from respective side surfaces constituting the substantially conical shape. A distance between a first line segment and a second line segment in the deepest portion of the trench is preferably 2 μm or less.

When each of the trenches has a cone shape, the trenches are preferably disposed in hexagonal packing, and are more preferably disposed in hexagonal closest packing. An example of this case will be described with reference to FIGS. 8, 9 and 10.

Figure 8:
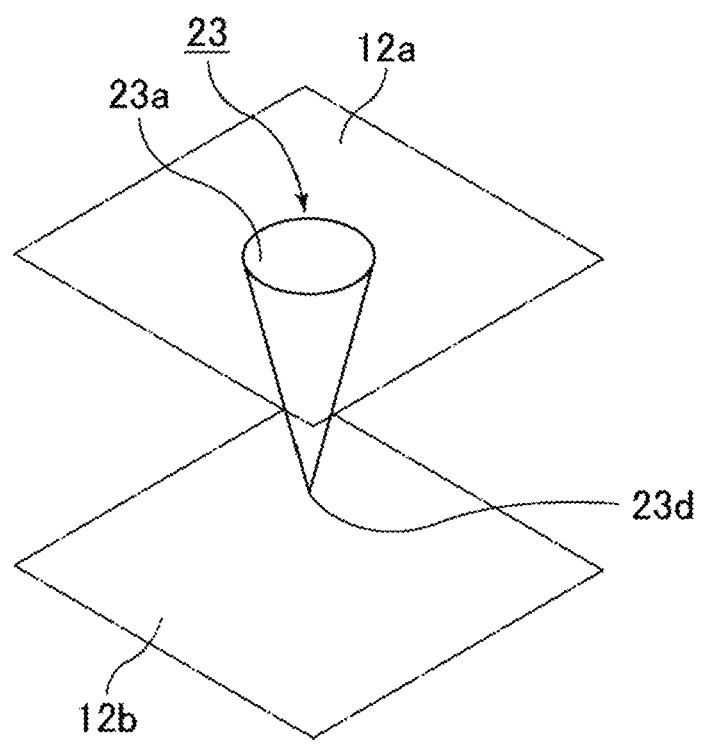
FIG. 8 is a perspective view schematically illustrating an example of a trench of a semiconductor device according to a second embodiment of the present invention.

FIG. 8 is a perspective view schematically illustrating an example of the trench of the semiconductor device according to the second embodiment of the present invention. A trench 23 has a cone shape having a side surface 23a, and has a sectional area taken along a plane parallel to a first main surface 12a of a semiconductor substrate 12, decreasing from the first main surface 12a toward a second main surface 12b.

Figure 9:
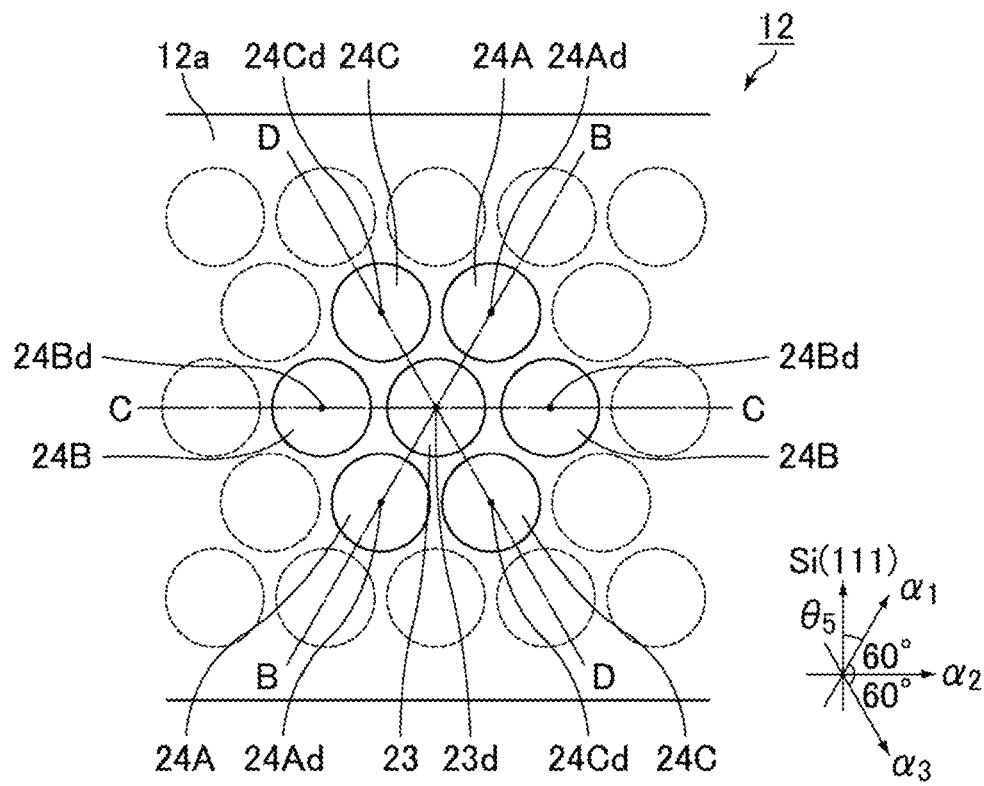
FIG. 9 is a top view illustrating an example of a layout in which the trench illustrated in FIG. 8 is disposed on a semiconductor substrate.

FIG. 9 is a top view illustrating an example of a layout in which the trench illustrated in FIG. 8 is disposed on a semiconductor substrate. The semiconductor substrate 12 is provided on the first main surface 12a with the trench 23 illustrated in FIG. 8, and a trench 24A, a trench 24B and a trench 24C that are identical in shape to the trench 23, in hexagonal packing. The trench 24A, the trench 24B, and the trench 24C are closest to the trench 23. Thus, an apex 23d of the trench 23 in a substantially conical shape and an apex 24Ad of the trench 24A in a substantially conical shape are connected in a direction (direction indicated by line B-B in FIG. 9) that is referred to as a first direction $\alpha_1$. The apex 23d of the trench 23 in a substantially conical shape and an apex 24Bd of the trench 24B in a substantially conical shape are connected in a direction (direction indicated by line C-C in FIG. 9) that is referred to as a first direction $\alpha_2$. Additionally, the apex 23d of the trench 23 in a substantially conical shape and an apex 24Cd of the trench 24C in a substantially conical shape are connected in a direction (direction indicated by line D-D in FIG. 9) that is referred to as a first direction $\alpha_3$. The semiconductor substrate 12 illustrated in FIG. 9 is configured such that all of the first directions $\alpha_1$, $\alpha_2$, and $\alpha_3$ do not align with a direction along a cleavage plane of the semiconductor substrate 12 (a direction indicated by Si (111) in FIG. 9), and the first direction $\alpha_1$ is inclined by $\theta_5$ with respect to the direction along the cleavage plane of the semiconductor substrate 12.

FIG. 9 illustrates the layout in which the first direction $\alpha_2$ is inclined by 60° with respect to the first direction $\alpha_1$. Thus, when the first direction $\alpha_1$ is inclined by 60° with respect to the direction along the cleavage plane of the semiconductor substrate 12 (when $\theta_5$ is 60°), the first direction $\alpha_3$ aligns with the direction along the cleavage plane of the semiconductor substrate 12. Thus, $\theta_5$ is preferably 5° to 55°, and 65° to 90°.

Figure 10:
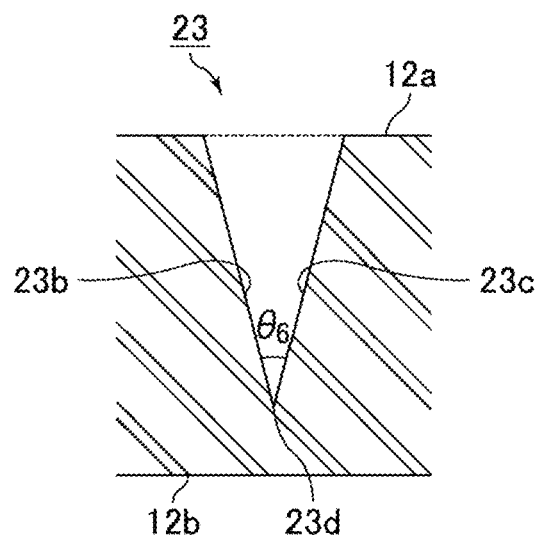
FIG. 10 is a sectional view of the trench illustrated in FIG. 9 taken along a line orthogonal to line B-B.

FIG. 10 is a sectional view of the trench illustrated in FIG. 9 taken along a line orthogonal to line B-B. As illustrated in FIG. 10, the trench 23 has a tapered shape in a section parallel to the thickness direction of the semiconductor substrate 12, the tapered shape having a first line segment 23b and a second line segment 23c that are not parallel to each other. Both the first line segment 23b and the second line segment 23c are a part of the side surface 23a in the section. An angle $\theta_6$ formed by the first line segment 23b and the second line segment 23c may be 30° or less. The first line segment 23b and the second line segment 23c are in contact with each other at a point that is the apex 23d of the trench 23 in a substantially conical shape. The trench 24A, the trench 24B, and the trench 24C are also similar in sectional shape to the trench 23.

The semiconductor device according to the second embodiment of the present invention includes the side surface constituting the trench that is not necessarily to be smooth, and that may be formed with asperities. When asperities are formed on the side surface constituting the trench, an angle formed by the first line segment and the second line segment can be obtained by the following method. However, each of the first line segment and the second line segment may not be a strict straight line. First, a trench is observed on a cut surface obtained by cutting the semiconductor substrate in a direction orthogonal to the first direction and parallel to the thickness direction of the semiconductor substrate. Then, on the cut surface, a line segment that minimizes the sum of squares of displacement from the first line segment and a line segment that minimizes the sum of squares of displacement from the second line segment are obtained. The two line segments form an angle that is an angle formed by the first line segment and the second line segment. The above method can be used even when the trench has a bottom surface.

The semiconductor device according to the second embodiment of the present invention may include trenches each having a pyramid shape.

Figure 11:
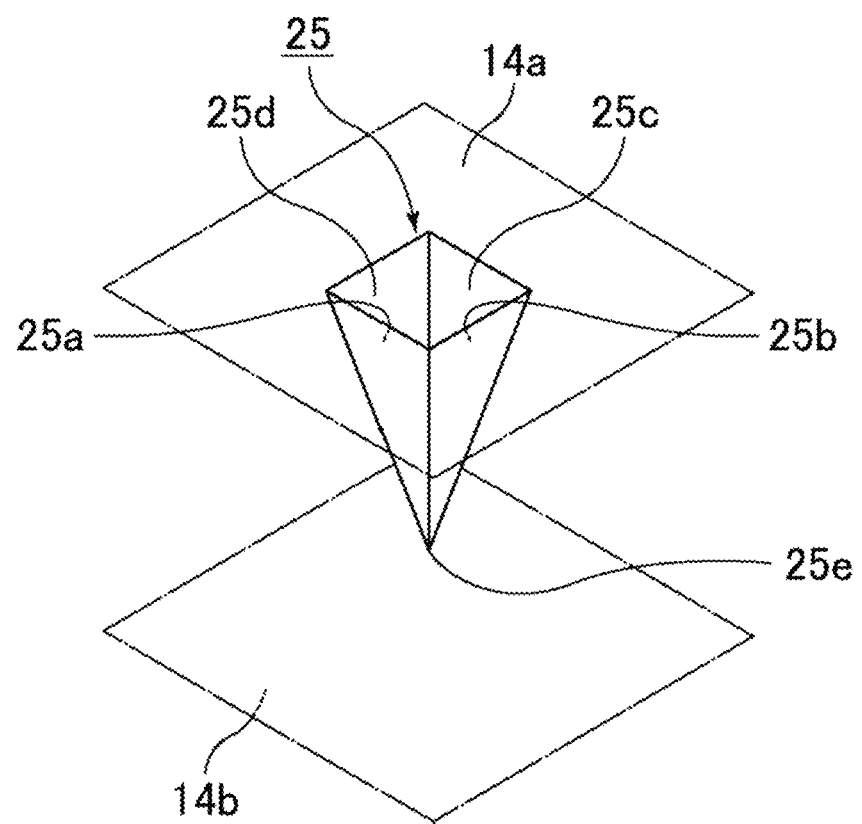
FIG. 11 is a perspective view schematically illustrating another example of the trench of the semiconductor device according to the second embodiment of the present invention.

FIG. 11 is a perspective view schematically illustrating another example of the trench of the semiconductor device according to the second embodiment of the present invention. A trench 25 has a quadrangular pyramid shape having a first side surface 25a, a second side surface 25b, a third side surface 25c, and a fourth side surface 25d, and has a sectional area taken along a plane parallel to a first main surface 14a of a semiconductor substrate 14, decreasing from the first main surface 14a toward a second main surface 14b.

When trenches each have a quadrangular pyramid shape, the trenches are preferably disposed in a lattice pattern. In this case, a second direction connecting apexes of the second closest trenches in a substantially conical shape preferably does not align with the cleavage plane of the semiconductor substrate. The number of trenches formed in the semiconductor substrate is three or more. The second direction does not align with the first direction. An example of disposing trenches each having a quadrangular pyramid shape in a lattice pattern will be described with reference to FIGS. 12 and 13.

Figure 12:
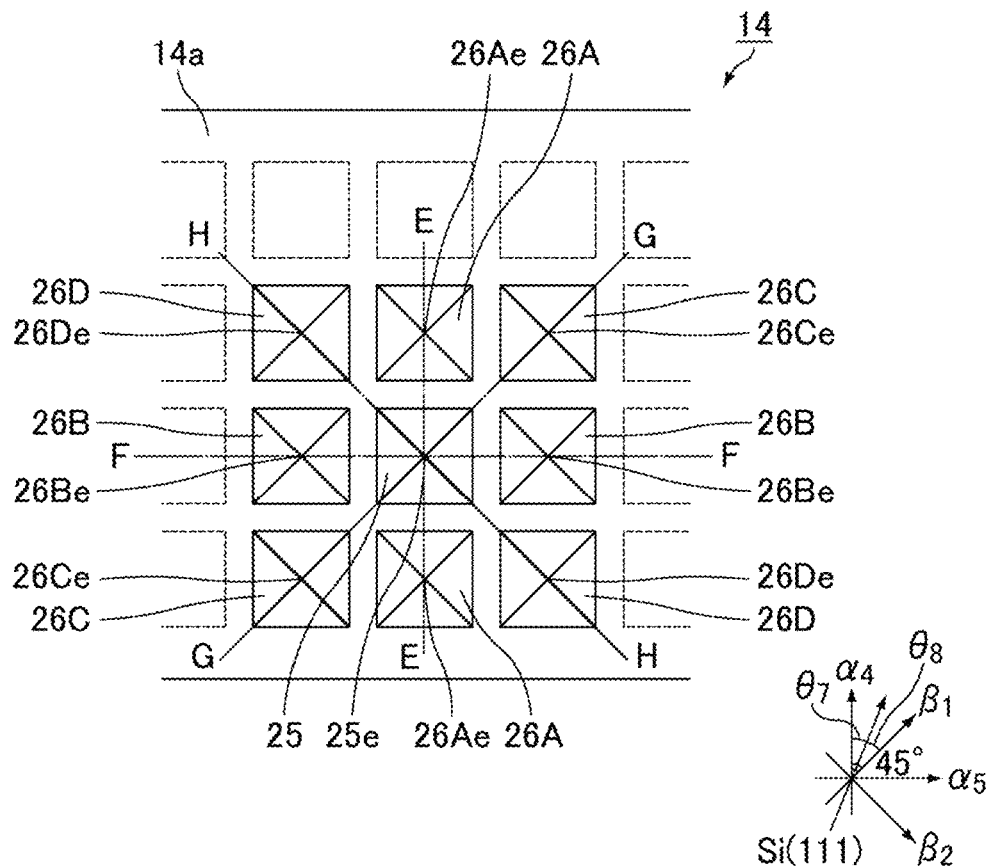
FIG. 12 is a top view illustrating an example of a layout in which the trench illustrated in FIG. 11 is disposed on a semiconductor substrate.

FIG. 12 is a top view illustrating an example of a layout in which the trench illustrated in FIG. 11 is disposed on a semiconductor substrate. When the trench 25 has a quadrangular pyramid shape, the trenches are preferably disposed in a lattice pattern as illustrated in FIG. 12. The semiconductor substrate 14 is provided on the first main surface 14a with the trench 25 and trenches 26A, 26B, 26C, and 26D that are identical in shape to the trench 25, in a lattice pattern. The trenches 26A as well as the trenches 26B are adjacent to each other across the trench 25. The trenches 26A and the trenches 26B are closest to the trench 25. Thus, an apex 25e of the trench 25 in a substantially conical shape and an apex 26Ae of each of the trenches 26A in a substantially conical shape are connected in a direction (direction indicated by line E-E in FIG. 12) that is referred to as a first direction $\alpha_4$. Additionally, the apex 25e of the trench 25 in a substantially conical shape and an apex 26Be of each of the trenches 26B in a substantially conical shape are connected in a direction (direction indicated by line F-F in FIG. 12) that is referred to as a first direction $\alpha_5$. The first direction $\alpha_5$ is inclined by 90° with respect to the first direction $\alpha_4$. The first direction $\alpha_4$ is inclined by $\theta_7$ with respect to a direction along a cleavage plane of the semiconductor substrate 14 (direction indicated by Si (111) in FIG. 12) and does not align with the direction.

The angle $\theta_7$ is preferably 5° to 85°.

The trenches 26C as well as the trenches 26D that are adjacent to each other across the trench 25 in a diagonal direction are second closest to the trench 25. Thus, the apex 25e of the trench 25 in a substantially conical shape and an apex 26Ce of each of the trenches 26C in a substantially conical shape are connected in a direction (direction indicated by line G-G in FIG. 12) that is referred to as a second direction $\beta_1$. Additionally, the apex 25e of the trench 25 in a substantially conical shape and an apex 26De of each of the trenches 26D in a substantially conical shape are connected in a direction (direction indicated by line H-H in FIG. 12) that is referred to as a second direction $\beta_2$. The second direction $\beta_1$ is inclined by 45° with respect to the first direction $\alpha_4$, and the second direction $\beta_2$ is inclined by 90° with respect to the second direction $\beta_1$. The second direction $\beta_1$ is inclined by $\theta_8$ with respect to the direction along the cleavage plane of the semiconductor substrate 14 (direction indicated by Si (111) in FIG. 12) and does not align with the direction.

The angle $\theta_7$ is preferably 5° to 85°.

Figure 13:
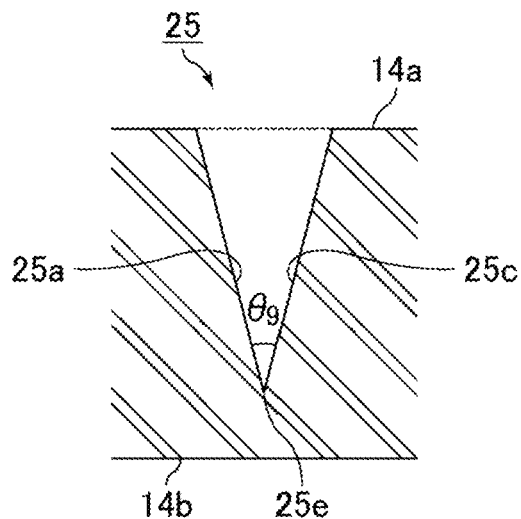
FIG. 13 is a sectional view of the trench illustrated in FIG. 12 taken along a line orthogonal to line E-E.

FIG. 13 is a sectional view of the trench illustrated in FIG. 12 taken along a line orthogonal to line E-E. As illustrated in FIG. 13, the trench 25 has a sectional shape in a section orthogonal to the first direction α4 and parallel to the thickness direction of the semiconductor substrate 14, the sectional shape having a first line segment 25a and a second line segment 25c that are not parallel to each other. The first line segment 25a is a part of the first side surface 25a in the section, and the second line segment 25c is a part of the third side surface 25c in the section. The trench 25 has a tapered shape in which a distance between the first line segment 25a and the second line segment 25c decreases from the first main surface 14a toward the second main surface 14b. An angle $\theta_9$ formed by the first line segment 25a and the second line segment 25c is preferably 30° or less.

The trench may include an interface in which an insulating layer provided on a surface of the first line segment and an insulating layer provided on a surface of the second line segment are in contact with each other. When the trench includes the interface in which the insulating layer provided on the surface of the first line segment and the insulating layer provided on the surface of the second line segment are in contact with each other, the semiconductor substrate is more likely to be stressed and cracked due to the insulating layers interfering with each other. In contrast, the semiconductor device according to the second embodiment of the present invention has the first direction that does not align with the direction along the cleavage plane of the semiconductor substrate. Thus, even when stress due to the insulating layers interfering with each other is applied to the substrate, a crack can be prevented from occurring.

The semiconductor device according to the second embodiment of the present invention may include a semiconductor substrate formed with two or more trenches different in shape. Placement of trenches is not limited to closest packing.

[Method for Manufacturing Semiconductor Device]

The semiconductor device of the present invention can be manufactured, for example, by a method including the steps of: forming a trench on a surface of a semiconductor substrate using a method such as etching; and sequentially forming a first electrode layer, a dielectric layer, a second electrode layer, a first extended portion, a second extended portion, a first external electrode, and a second external electrode on the surface of the semiconductor substrate formed with the trench, using a method such as photolithography. At this time, a shape and placement of each of the trenches are set so that the first direction does not align with a direction along a cleavage plane of the semiconductor substrate.

The direction along the cleavage plane of the semiconductor substrate can be measured using X-ray azimuth measurement. When a semiconductor wafer is used as the semiconductor substrate, an orientation flat or a cut-out (also called a notch) formed on the semiconductor wafer may be used as a reference for the cleavage plane. However, the orientation flat and the notch each have a deviation of about 1° to 2° from a specified surface. Thus, the shape and the placement of each of the trenches are preferably adjusted so that the first direction is inclined by 5° or more from the direction along the cleavage plane of the semiconductor substrate determined based on the orientation flat or the notch.

What is claimed is:

1. A semiconductor device comprising:
   a semiconductor substrate including a first main surface and a second main surface facing each other in a thickness direction, the first main surface including a trench having:
      a depth in the thickness direction of the semiconductor substrate and having a substantially wedge shape that has a first side surface and a second side surface that face each and are not parallel to each other, and
      a first end surface and a second end surface that face each and are substantially parallel to each other, and
      the first side surface and the second side surface intersect each other at a line, or extension surfaces of the first side surface and the second side surface in the thickness direction intersect each other at a line, and the line extends in a first direction that does not align with a cleavage plane of the semiconductor substrate;
   an insulating layer on the first and second side surfaces of the trench;
   a first electrode layer on the insulating layer;
   a dielectric layer on the first electrode layer; and
   a second electrode layer on the dielectric layer.

2. The semiconductor device according to claim 1, wherein the line has a length that is 50% or more of a length of the semiconductor substrate existing on an extension line extended from the line.

3. The semiconductor device according to claim 2, wherein the line has a length that is 90% or less of the length of the semiconductor substrate.

4. The semiconductor device according to claim 1, wherein
   the first main surface of the semiconductor substrate includes a plurality of the trenches, and
   each of the plurality of the trenches has the line that extends in the first direction.

5. The semiconductor device according to claim 1, wherein the trench has a tapered sectional shape in a direction parallel to the first end surface and the second end surface.

6. The semiconductor device according to claim 1, wherein
   in a cut surface of the semiconductor substrate in a direction parallel to the first end surface and the second end surface, the first side surface and the second side surface extend shorter in the thickness direction of the semiconductor substrate than the first end surface and the second end surface of the trench, the trench includes a third side surface between the first main surface of the semiconductor substrate and the first side surface, and the trench includes a fourth side surface between the first main surface of the semiconductor substrate and the second side surface, and that faces the third side surface.

7. The semiconductor device according to claim 1, wherein in a cut surface of the semiconductor substrate in a direction parallel to the first end surface and the second end surface, the first side surface and the second side surface form an angle of 30° or less.

8. The semiconductor device according to claim 1, wherein a distance between the first side surface and the second side surface at a deepest portion of the trench in the thickness direction is 2 μm or less.

9. The semiconductor device according to claim 1, wherein the trench includes an interface in which the insulating layer on the first side surface and the insulating layer on the second side surface are in contact with each other.

10. The semiconductor device according to claim 1, wherein the first direction is inclined from the cleavage plane of the semiconductor substrate by an angle within a range of from 5° to 85° in the first main surface.

11. The semiconductor device according to claim 1, wherein the insulating layer has a thickness of 1 μm or more.

12. The semiconductor device according to claim 1, wherein the insulating layer comprises an oxide of a material of the semiconductor substrate.

13. The semiconductor device according to claim 1, wherein the semiconductor substrate is a silicon substrate, and the first main surface is a Si {100} plane, and the cleavage plane is a Si {111} plane.

14. The semiconductor device according to claim 13, wherein the insulating layer comprises silicon oxide.

* * * * *